United States Patent
Jiang

(10) Patent No.: US 11,961,587 B2
(45) Date of Patent: Apr. 16, 2024

(54) CLOCK DRIVER AND MEMORY DEVICE COMPRISING THE SAME

(71) Applicant: MONTAGE TECHNOLOGY (KUNSHAN) CO., LTD., Suzhou (CN)

(72) Inventor: Yibo Jiang, San Jose, CA (US)

(73) Assignee: MONTAGE TECHNOLOGY (KUNSHAN) CO., Suzhou (CN)

( * ) Notice: Subject to any disclaimer, the term of this patent is extended or adjusted under 35 U.S.C. 154(b) by 141 days.

(21) Appl. No.: 17/847,156

(22) Filed: Jun. 22, 2022

(65) Prior Publication Data

US 2023/0420016 A1 Dec. 28, 2023

(51) Int. Cl.
*G11C 7/22* (2006.01)
*G11C 7/10* (2006.01)

(52) U.S. Cl.
CPC .......... *G11C 7/222* (2013.01); *G11C 7/1012* (2013.01); *G11C 7/1057* (2013.01); *G11C 7/1084* (2013.01)

(58) Field of Classification Search
CPC ..... G11C 7/222; G11C 7/1012; G11C 7/1057; G11C 7/1084
USPC ...................................................... 365/233.1
See application file for complete search history.

(56) References Cited

U.S. PATENT DOCUMENTS

2009/0002042 A1* 1/2009 Rausch .................. G11C 29/02
327/175

* cited by examiner

*Primary Examiner* — Huan Hoang
(74) *Attorney, Agent, or Firm* — Jun He Law Offices P.C; James J. Zhu

(57) ABSTRACT

A clock driver comprises: an input multiplexer for receiving a plurality pairs of input clock signals and an input selection signal, and for selectively outputting one pair of the plurality pairs of input clock signals according to the input selection signal; a phase locking loop (PLL) coupled to the input multiplexer to receive one pair of the plurality pairs of input clock signals, and for generating a PLL clock signal according to the received pair of input clock signals; at least two sets of output multiplexers coupled to the PLL to receive the PLL clock signal and an output selection signal, wherein each set of output multiplexers are configured to selectively output the PLL clock signal as a set of output clock signals according to the output selection signal to drive at least one group of memory chips; and a control module configured to detect toggling of the plurality pairs of input clock signals and generate the input selection signal and the output selection signal based on a detection result of the toggling of the plurality pairs of input clock signals.

14 Claims, 2 Drawing Sheets

CLOCK DRIVER AND MEMORY DEVICE COMPRISING THE SAME

TECHNICAL FIELD

The present application generally relates to memory technology, and more particularly, to a clock driver and a memory device comprising such clock driver.

BACKGROUND

A dual in-line memory module (DIMM) is a memory module that integrates multiple memory chips (e.g., dynamic random access memory (DRAM) chips) on a substrate (e.g., a printed circuit board (PCB)), which is also called as raw card.

Some types of DIMMs such as unbuffered dual inline memory modules (UDIMMs) and small outline dual inline memory modules (SODIMMs) are generally used in personal computers and laptop computers, and thus do not have a centralized clock driver that can generate clock signals for coordinating the operation of sets of memory chips on the DIMMs. These DIMMs generally receive clock signals directly from an external host controller such as a central processing unit (CPU). However, due to the continued increase in the frequency of clock signals, more severe jittering problem may occur to the clock signals when they are received by the sets of memory chips on the DIMMs. Therefore, a clock driver may be added onto the DIMM and coupled between the host controller and the sets of memory chips. The host controller may provide clock signals differently from those conventional clock signals for driving DIMMs without on-board clock drivers.

If two or more subchannels of DRAM memory chips are integrated on the same raw card, two or more clock signals are desired so that the subchannels of DRAM memory chips can be driven respectively. Phase locking loop(s) (PLL(s)) are required to generate on-board clock signals based on external clock signals provided to the raw cards. If each subchannel of DRAM memory chips are driven by a PLL (two-PLL mode), there is more flexibility on the per subchannel power management but more normal operation power is required. On the contrary, if both of the subchannels of DRAM memory chips are driven by a single PLL (single-PLL mode), there is less normal operation power but less flexibility on the per sub-channel power management.

Therefore, there is a need for further improvement of the existing clock driver.

SUMMARY

An objective of the present application is to provide a clock driver that has one-PLL circuitry with two input clock signal mechanism.

In an aspect of the present application, there is provided a clock driver. The clock driver comprises: an input multiplexer for receiving a plurality pairs of input clock signals and an input selection signal, and for selectively outputting one pair of the plurality pairs of input clock signals according to the input selection signal; a phase locking loop (PLL) coupled to the input multiplexer to receive one pair of the plurality pairs of input clock signals, and for generating a PLL clock signal according to the received pair of input clock signals; at least two sets of output multiplexers coupled to the PLL to receive the PLL clock signal and an output selection signal, wherein each set of output multiplexers are configured to selectively output the PLL clock signal as a set of output clock signals according to the output selection signal to drive at least one group of memory chips; and a control module configured to detect toggling of the plurality pairs of input clock signals and generate the input selection signal and the output selection signal based on a detection result of the toggling of the plurality pairs of input clock signals.

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

DETAILED DESCRIPTION OF THE EMBODIMENTS

Figure 1:
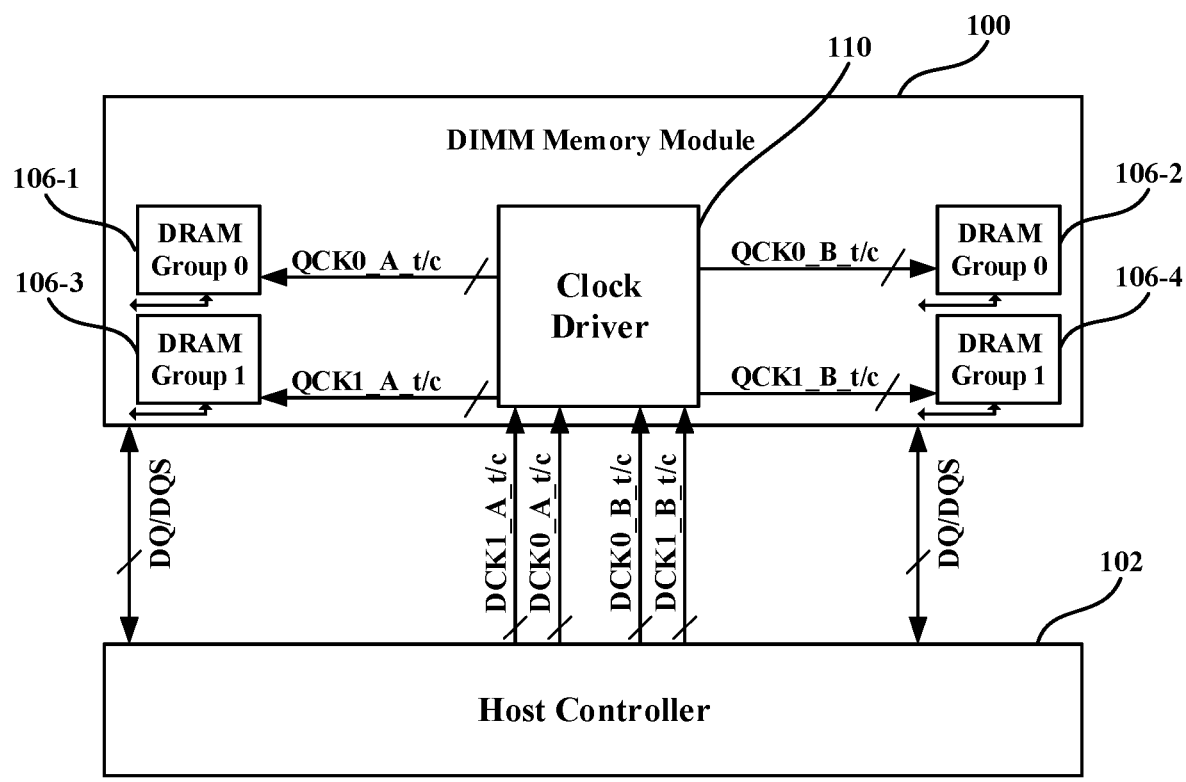
FIG. 1 shows a memory device 100 according to an embodiment of the present application.

In the following detailed description, reference is made to the accompanying drawings which form a part hereof. In the drawings, similar reference numerals generally refer to similar parts unless the context clearly dictates otherwise. The illustrative embodiments described in the detailed description, drawings and claims are not intended to be limiting. Other embodiments may be employed and other changes may be made without departing from the spirit or scope of the subject matter of the present application. It is to be understood that various configurations, substitutions, combinations and designs of the various forms of the present application, which are generally described in this application and are illustrated in the drawings, are intended to constitute a part of the present application.

FIG. 1 shows a memory device 100 according to an embodiment of the present application. As shown in FIG. 1, the memory device 100 may be coupled to a host controller 102 to exchange data with the host controller 102. The host controller 102 can be a central processing unit, which may access to the memory device 100 by providing, for example, a write instruction of writing data into the memory device 100, or a read instruction of reading data from the memory device 100. In certain embodiments, the memory device 100 may be a memory device in accordance with the JEDEC double data rate synchronous dynamic random access memory (DDR SDRAM) standards, including the JEDEC DDR2, DDR3, DDR4, DDR5 or any other suitable DDR standards, for example.

In an embodiment, the memory device 100 may include a plurality groups of DRAM memory chips, e.g., four groups of DRAM memory chips 106-1 to 106-4 as shown in FIG. 1. In some other embodiments, the memory device 100 may include two or more groups of memory chips. Furthermore, a clock driver 110 is integrated within the memory device 100 and coupled between the groups of memory chips 106-1 to 106-4 and the host controller 102. The clock driver 110 can receive a plurality pairs of input clock signals from the host controller 102 and then provide these pairs of input clock signals to the groups of DRAM memory chips 106-1 to 106-4. In the example shown in FIG. 1, the four groups of memory chips 106-1 to 106-4 constitute two subchannels, and accordingly two pairs of input clock signals DCK_A_t/c and DCK_B_t/c are received from the host controller 102, with each pair driving a subchannel of memory chips. In particular, four pairs of output clock signals QCK0_A_t/c, QCK0_B_t/c, QCK1_A_t/c and QCK1_B_t/c can be generated from the two pairs of input clock signals, with each pair driving a group of DRAM memory chips. The generation of the pairs of output clock signals QCK0_A_t/c, QCK0_B_t/c, QCK1_A_t/c and QCK1_B_t/c will be elaborated below with more details. The groups of memory chips are also coupled to the host controller 102 via respective data buses DQ/DQS as shown in FIG. 1, which enables the data interaction between the groups of memory chips and the host controller 102. It can be appreciated that the memory device 100 may include more subchannels of memory chips, and thus more pairs of output clock signals can be generated and provided to drive the subchannels of memory chips based on more pairs of input clock signals received from the host controller 102.

Figure 2:
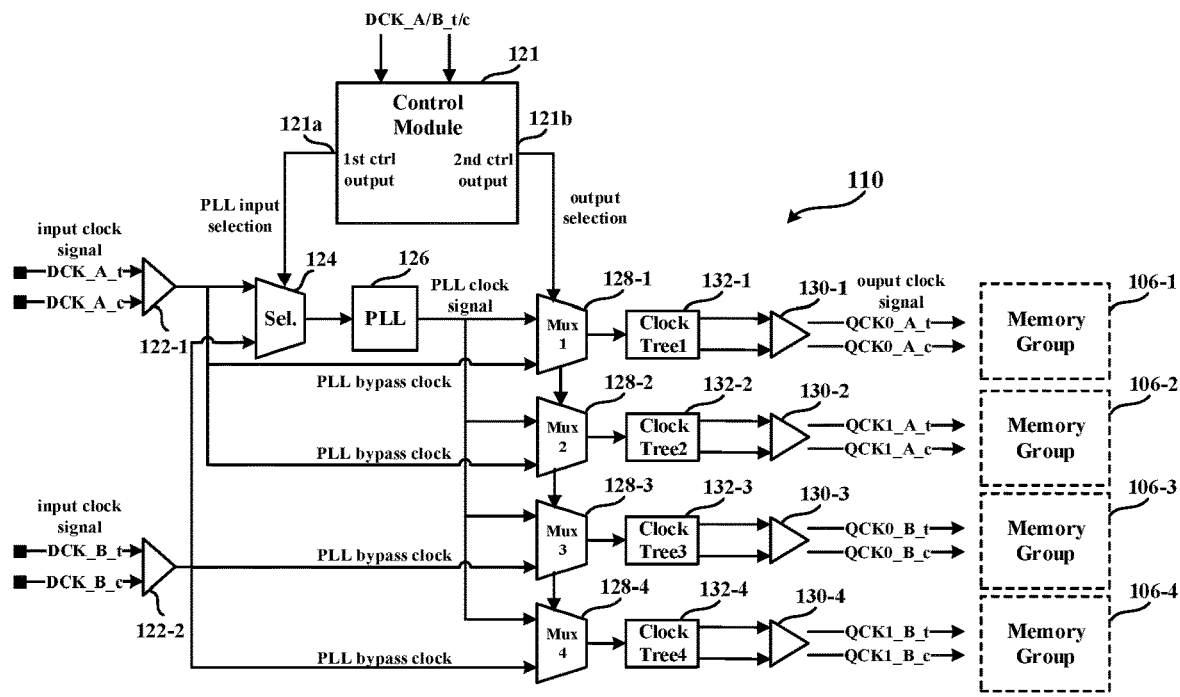
FIG. 2 shows a clock driver of the memory device 100 shown in FIG. 1 according to an embodiment of the present application.

FIG. 2 shows a clock driver 110 of the memory device 100 shown in FIG. 1 according to an embodiment of the present application.

As shown in FIG. 2, the clock driver 110 receives two pairs of input clock signals DCK_A_t/c and DCK_B_t/c via two respective input buffers 122-1 and 122-2. An input clock selector 124 is coupled to the input buffers 122-1 and 122-2 to selectively pass the pairs of input clock signals to a phase locking loop (PLL) 126. In particular, the input clock selector 124 may receive an input selection signal at its control node, and then select one pair from the pairs of input clock signals DCK_A_t/c and DCK_B_t/c according to the input selection signal. The input selection signal can be generated by a control module 121 and output by the control module 121 at its first control output node 121a. The control module 121 can detect the toggling of the pairs of input clock signals to check whether they are active or not, and generate the input selection signal and an output selection signal. The PLL 126 can generate a PLL clock signal according to the pair of input clock signals passed by the input clock selector 124. It can be appreciated that any suitable PLL circuitry may be used for the PLL 126. In some embodiments, the PLL clock signal generated by the PLL 126 can be a single-ended signal, while in some other embodiments, the PLL clock signal can be a differential signal, i.e., composed of a pair of differential signals. In the following, the PLL clock signal is exemplarily described as a differential signal, but it can be understood that the single-ended PLL clock signal can work similarly for clocking purpose.

Furthermore, four multiplexers 128-1 to 128-4 are coupled to the output of the PLL 126 to receive the PLL clock signals. In some embodiments, the four multiplexers 128-1 to 128-4 are further coupled to the input buffers 122-1 and 122-2 to receive the two pairs of input clock signals DCK_A_t/c and DCK_B_t/c directly. In particular, two of the four multiplexers, i.e., the multiplexers 128-1 and 128-2 are coupled to the input buffer 122-1 to receive the pair of input clock signals DCK_A_t/c directly, and the other two of the four multiplexers, i.e., the multiplexers 128-3 and 128-4, are coupled to the input buffer 122-2 to receive the pair of input clock signals DCK_B_t/c directly. In this way, the input clock selector 124 and the PLL 126 can be selectively bypassed, thereby providing a pair of bypass clock signals which are different from the PLL clock signals generated by the PLL 126 to the multiplexers 128-1 to 128-4. Furthermore, the multiplexers 128-1 to 128-4 are all coupled to receive the output selection signal generated by the control module 121, which enables selectively outputting of the PLL clock signals and the PLL bypass clock signals, or disables the outputting of any of the PLL clock signals and the PLL bypass clock signals. In particular, the multiplexers 128-1 to 128-4 may have respective control nodes. The control nodes are all coupled to a second control output node 121b of the control module 121 to receive the output selection signal. Although it is shown in FIG. 2 two multiplexers 128-1 and 128-2 are coupled to the input buffer 122-1 to receive the pair of input clock signals DCK_A_t/c, and two other multiplexers 128-3 and 128-4 are coupled to the input buffer 122-2 to receive the pair of input clock signals DCK_B_t/c, more multiplexers can be included in the clock driver 110 and coupled to either pair of the two pairs of input clock signals DCK_A_t/c and DCK_B_t/c, depending on the number of groups of memory chips in each subchannel of DRAM memory chips. For example, if there are two subchannels and each subchannel of DRAM memory chips includes four groups of memory chips, then four multiplexers can be coupled to the input buffer 122-1 to receive the pair of input clock signals DCK_A_t/c and to receive the PLL clock signals, and another four multiplexers can be coupled to the input buffer 122-2 to receive the pair of input clock signals DCK_B_t/c and to receive the PLL clock signals.

Still referring to FIG. 2, all the multiplexers 128-1 to 128-4 may send their output clock signals to the respective groups of memory chips 106-1 to 106-4 via four output buffers 130-1 to 130-4, respectively. Therefore, the groups of memory chips 106-1 to 106-4 disposed on the DEVIM memory module where the clock driver 110 is also disposed can be driven by the desired pairs of clock signals accordingly. In some embodiments, four clock trees 132-1 to 132-4 may be coupled between the multiplexers 128-1 to 128-4 and the output buffers 130-1 to 130-4, respectively. Each clock tree may introduce an offset into the pair of clock signals passing therethrough, so that the pairs of clock signals outputted by the clock driver 110 may have different offsets that may be desired by different groups of memory chips. It can be appreciated that less clock trees may be used in some other embodiments. Furthermore, in some other embodiments, other functional modules such as frequency dividers or frequency multipliers may be coupled to the outputs of the multiplexers 128-1 to 128-4 to reduce or increase the frequency of the clock signals output by the multiplexers, for example.

As aforementioned, the input clock signals can be selectively passed to the PLL 126 by the input clock selector 124, depending on the input selection signal received at the control node of the input clock selector 124. Table 1 below shows a function table of the input clock selector according to an exemplary embodiment of the present application. As shown in Table 1, the input selection signal can be a 2-bit control word "00", "01", "10" or "11". When the 2-bit control word is "00", the input clock selector 124 can be selected to send the pair of input clock signals DCK_A_t/c to the PLL 126. When the 2-bit control word is "01", the input clock selector 124 can be selected to send the pair of input clock signals DCK_B_t/c to the PLL 126. Furthermore, when the 2-bit control word is "10", the clock driver may be enabled to automatically detect the input clock signals DCK_A_t/c and DCK_B_t/c, so as to check whether one pair or both pairs are turned off or not. Under such condition, by the control module 121 can detect the toggling (i.e., turn-on or turn-off state) of the two pairs of input clock signals DCK_A_t/c and DCK_B_t/c, and then generate the PLL clock signals based on a state machine which will be elaborated below. The 2-bit control word of "11" can be reserved for other functions.

TABLE 1

Function Table of Input Clock Selector

| Input Clock Selection Signal | | Input Function |
|---|---|---|
| 0 | 0 | DCK_A_t/c is selected |
| 0 | 1 | DCK_B_t/c is selected |
| 1 | 0 | Selection based on clock detection status |
| 1 | 1 | Reserved |

Figure 3:
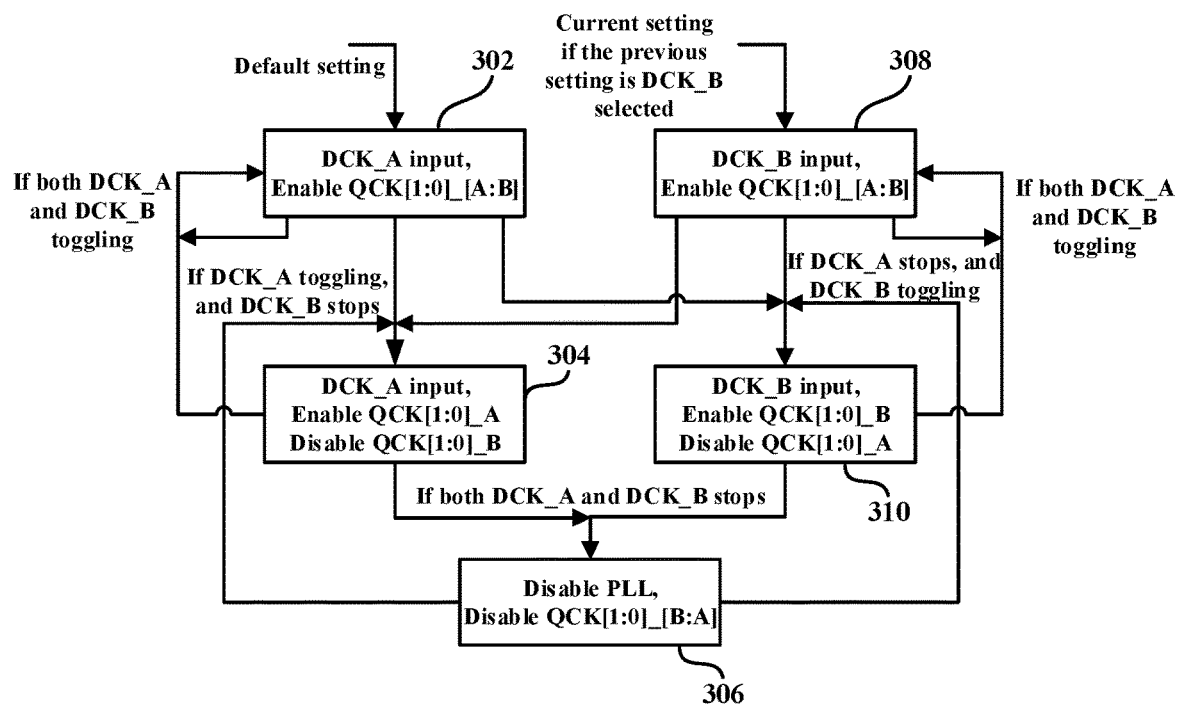
FIG. 3 shows an input clock detection and adaption statement machine according to an embodiment of the present application.

FIG. 3 shows an input clock detection and adaption statement machine according to an embodiment of the present application. In some embodiments, the state machine can be implemented in an internal controller (e.g., the control module 121 shown in FIG. 2) of the clock driver, which can be pre-programmed by the host controller via a sideband bus, for example. The control module can detect the toggling of the pairs of input clock signals.

The state machine can implement a control strategy based on the status of the input clock signals. When both the pairs of input clock signals DCK_A_t/c and DCK_B_t/c are toggling, all the pairs of output clock signals can run normally with both sub-channels working normally. When the pair of input clock signals DCK_A_t/c is turned off by the host controller and not detected toggling, the corresponding pairs of output clock signals QCK0_A_t/c and QCK1_A_t/c and the corresponding sub-channel of memory chips may be turned off to save power. However, the PLL 126 may continue to run with the pair of input clock signals DCK_B_t/c as its input, and the corresponding pairs of output clock signals QCK0_B_t/c and QCK1_B_t/c and the corresponding sub-channel of memory chips may work normally. Similarly, the pairs of output clock signals QCK0_B_t/c and QCK1_B_t/c and the corresponding sub-channel of memory chips can be turned off, when the pair of input clock signals DCK_B_t/c are turned off by the host controller.

In particular, as shown in FIG. 3, there are five states with different controls to the input detection for the PLL 126 and signal output for the multiplexers 128-1 to 128-4. The transition between different states of the state machine is based on the clock detection result on the pairs of input clock signals DCK_A_t/c and DCK_B_t/c. In an example, as shown in state 302, a default setting can be applied to the clock driver 110, which selects the pair of input clock signals DCK_A_t/c as the input of the PLL 126 and enables the outputting of the output clock signals QCK0_A_t/c, QCK1_A_t/c, QCK0_B_t/c and QCK1_B_t/c at the output buffers 130-1 to 130-4. Enabling or disabling the outputting of the output clock signals can be controlled by the multiplexers 128-1 to 128-4. In state 302, the multiplexers 128-1 to 128-4 can be controlled to pass the pair of PLL clock signals which is based on the pair of input clock signals DCK_A_t/c to the clock trees 132-1 to 132-4 and then to the output buffers 130-1 to 130-4. In this way, all the four groups of memory chips 106-1 to 106-4 can be driven by the respective four pairs of output clock signals QCK0_A_t/c, QCK1_A_t/c, QCK0_B_t/c and QCK1_B_t/c, respectively.

If it is detected that the pair of input clock signals DCK_A_t/c is toggling but the pair of input clock signals DCK_B_t/c stop toggling, then the state machine may transit from state 302 to state 304. As the pair of input clock signals DCK_A_t/c is toggling normally, the PLL 126 may generate the PLL clock signals based on the pair of input clock signals DCK_A_t/c. That the pair of input clock signals DCK_B_t/c stop toggling indicates that it is not desired to drive the groups of memory chips 106-3 and 106-4. Accordingly, the multiplexers 128-1 to 128-2 can be enabled to allow the outputting of the output clock signals QCK0_A_t/c and QCK1_A_t/c to the groups of memory chips 106-1 and 106-2, while the multiplexers 128-3 to 128-4 can be disabled to stop the outputting of the output clock signals QCK0_B_t/c and QCK1_B_t/c to the groups of memory chips 106-3 and 106. In this way, the groups of memory chips 106-1 and 106-2 can be driven by the output clock signals QCK0_A_t/c and QCK1_A_t/c and operate normally, but the groups of memory chips 106-3 and 106-4 may not operate normally. For example, the groups of memory chips 106-3 and 106-4 may enter into a self-refresh power saving mode to save power.

In state 302, if the pair of input clock signals DCK_A_t/c and the pair of input clock signals DCK_B_t/c are both toggling, then the state machine may maintain in state 302. Similarly, in state 304, if it is detected that the pair of input clock signals DCK_A_t/c and the pair of input clock signals DCK_B_t/c are both toggling, then the state machine may transit from state 304 to 302.

Although it is default setting to select the pair of input clock signals DCK_A_t/c as the input of the PLL 126, if the previous setting during operation is that the pair of input clock signals DCK_B_t/c are selected, then the input selection 124 can continue to select the pair of input clock signals DCK_B_t/c as the input of the PLL 126, as shown in state 308. At this time, the multiplexers 128-1 to 128-4 are all enabled to output the output clock signals QCK0_A_t/c, QCK1_A_t/c, QCK0_B_t/c and QCK1_B_t/c via the output buffers 130-1 to 130-4, respectively. These output clock signals are all generated by the PLL 126 based on the selected pair of input clock signals DCK_B_t/c. In this way, all the four groups of memory chips 106-1 to 106-4 can be driven by the output clock signals QCK0_A_t/c, QCK1_A_t/c, QCK0_B_t/c and QCK1_B_t/c, respectively.

If it is detected that the pair of input clock signals DCK_A_t/c stops toggling but the pair of input clock signals DCK_B_t/c are toggling normally, then the state machine may transit from state 308 to state 310. As the pair of input clock signals DCK_B_t/c are toggling normally, the PLL 126 may generate the PLL clock signals based on the pair of input clock signals DCK_B_t/c. That the pair of input clock signals DCK_A_t/c stop toggling indicates that it is not desired to drive the groups of memory chips 106-1 and 106-2. Accordingly, the multiplexers 128-3 to 128-4 can be enabled to allow the outputting of the output clock signals QCK0_B_t/c and QCK1_B_t/c to the groups of memory chips 106-3 and 106-4, while the multiplexers 128-1 to 128-2 can be disabled to stop the outputting of the output clock signals QCK0_A_t/c and QCK1_A_t/c. In this way, the groups of memory chips 106-3 and 106-4 can be driven by the output clock signals QCK0_B_t/c and QCK1_B_t/c and operate normally, but the groups of memory chips 106-1 and 106-2 may not operate normally. For example, the groups of memory chips 106-1 and 106-2 may enter into a self-refresh power saving mode to save power.

Similar as state 302, in state 308, if the pair of input clock signals DCK_B_t/c and the pair of input clock signals DCK_A_t/c are both toggling, then the state machine may maintain in state 308. Furthermore, in state 310, if it is detected that the pair of input clock signals DCK_A_t/c and the pair of input clock signals DCK_B_t/c are both toggling, then the state machine may transit from state 310 to 308.

In state 302, if it is detected that the pair of input clock signals DCK_A_t/c stops toggling but the pair of input clock signals DCK_B_t/c are toggling normally, then the state machine may transit from state 302 to state 310. Similarly, if it is detected that the pair of input clock signals DCK_B_t/c stops toggling but the pair of input clock signals DCK_A_t/c are toggling normally, then the state machine may transit from state 302 to state 304.

Furthermore, in state 304 or state 310, if both of the pairs of input clock signals DCK_A_t/c and the pair of input clock signals DCK_B_t/c stop toggling, the PLL 126 may be disabled such that all the output clock signals QCK0_A_t/c, QCK1_A_t/c, QCK0_B_t/c and QCK1_B_t/c may be disabled as well, as shown in state 306. At this time, all the groups of memory chips 106-1 to 106-4 may not be driven by any clock signals and thus do not operate normally.

The state machine may transit from state 306 back to an enabled state such as state 304 and state 310, if either of the pair of input clock signals DCK_A_t/c and DCK_B_t/c is detected toggling normally. For example, if it is detected that the pair of input clock signals DCK_A_t/c is toggling but the pair of input clock signals DCK_B_t/c stop toggling, the state machine may transit from state 306 to state 304. If it is detected that the pair of input clock signals DCK_B_t/c is toggling but the pair of input clock signals DCK_A_t/c stop toggling, the state machine may transit from state 306 to state 310.

It should be noted that, during the state transitions, certain turn-around time may be required and the input clock signals may not be stable. Accordingly, the host controller 102 may be required not to send any commands during the turn-around time to avoid any mis-sampling by the memory device 100.

Still referring to FIG. 2, during operation, the PLL 126 can lock its frequency and phase to either of the pairs of input clock signals DCK_A_t/c and DCK_B_t/c. Thus, the pairs of input clock signals DCK_A_t/c and DCK_B_t/c should have the same frequency. Moreover, due to the phase offset between the two pairs of input clock signals DCK_A_t/c and DCK_B_t/c, the host controller may need to perform calibration separately with either of the two pairs of input clock signals DCK_A_t/c and DCK_B_t/c to achieve proper phase alignment between the pairs of output clock signals and a chip select (CS) signal and a command/address (CA) signal received at the memory interface between the memory device 100 and the host controller 102, i.e., where the pairs of input clock signals are received. Therefore, a calibration process may be performed during the initialization of the memory device 100. In particular, after power-up, the host controller 102 may first configure the pair of input clock signals DCK_A_t/c as the input of the PLL 126. Once the PLL 126 locks with the pair of input clock signals DCK_A_t/c, the host controller 102 may perform calibration for all the groups of memory chips 106-1 to 106-4 and record a set of calibration values Val_A. Each of the calibration values represents a respective offset in phase between a pair of output clock signals and the CS signal or the CA signal when the pair of input clock signals DCK_A_t/c is the source and input of the PLL 126. Then the host controller 102 may further configure the pair of input clock signals DCK_B_t/c as the input of the PLL 126. Once the PLL 126 locks with the pair of input clock signals DCK_B_t/c, the host controller 102 may perform the same calibration and record another set of calibration values Val_B. Each of the calibration values Val_B represents a respective offset in phase between a pair of output clock signals and the CS signal or the CA signal when the pair of input clock signals DCK_B_t/c is the source and input of the PLL 126. After the calibration sequence, if the host controller 102 configures the clock driver 110 to work under the "selection based on clock detection status" setting as elaborated with reference to the process shown in FIG. 3, the host controller 102 may apply the appropriate set of calibration values Val_A or Val_B which are obtained during the calibration process to the CS/CA timings. Accordingly, phase alignment between the output clock signals generated by the clock driver and the CS/CA signals at the interface of memory chips can be achieved very fast, even if the source of the PLL 126 changes during operation.

As can be seen from the above embodiments of the present application, with the proposed one-PLL circuitry with two input clock signal mechanism, the clock driver can not only have equivalent power consumption as the single-PLL mode during normal operation, but also have the per sub-channel self-refresh power saving capability as the two-PLL mode.

It should be noted that although several steps of the method for clocking a memory device and several modules or sub-modules of a clock driver for a memory device are described in the above description, this division is merely exemplary rather than mandatory. In fact, according to the embodiments of the present application, features and functions of two or more modules described above may be embodied in one module. Conversely, features and functions of one module described above can be further divided into a plurality of modules.

Those skilled in the art will be able to understand and implement other variations to the disclosed embodiments by studying the specification, the application, the drawings and the appended claims. In the claims, the words "include" or "including" do not exclude other elements and steps, and the words "a" or "an" do not exclude the plural. In the practical application of the present application, one part may perform the functions of a plurality of technical features cited in the claims. Any reference numerals in the claims should not be construed as limiting the scope.

What is claimed is:
1. A clock driver, comprising:
an input multiplexer for receiving a plurality pairs of input clock signals and an input selection signal, and for selectively outputting one pair of the plurality pairs of input clock signals according to the input selection signal;
a phase locking loop (PLL) coupled to the input multiplexer to receive one pair of the plurality pairs of input clock signals, and for generating a PLL clock signal according to the received pair of input clock signals;

at least two sets of output multiplexers coupled to the PLL to receive the PLL clock signal and an output selection signal, wherein each set of output multiplexers are configured to selectively output the PLL clock signal as a set of output clock signals according to the output selection signal to drive at least one group of memory chips; and a control module configured to detect toggling of the plurality pairs of input clock signals and generate the input selection signal and the output selection signal based on a detection result of the toggling of the plurality pairs of input clock signals.

2. The clock driver of claim 1, further comprising:
at least two sets of clock trees, each clock tree being coupled between an output multiplexer of the at least two sets of output multiplexers and a group of memory chips and configured for introducing an offset into the set of output clock signals for the group of memory chips.

3. The clock driver of claim 2, further comprising:
at least two sets of output buffers, each output buffer being coupled between a clock tree and a group of memory chips.

4. The clock driver of claim 1, wherein each set of the at least two sets of output multiplexers are further coupled to receive a pair of input clock signals as a pair of bypass clock signals, and the output multiplexers are further configured to selectively output the pair of bypass clock signals and the pair of PLL output signals according to the output selection signal.

5. The clock driver of claim 1, wherein the control module is configured to disable the outputting of a set of output clock signals which are associated with a pair of input clock signals according to a detection result indicating that the pair of input clock signals are not toggling.

6. The clock driver of claim 1, wherein the control module is configured to control the input multiplexer to send either of the plurality pairs of input clock signals to the PLL, and enable the at least two sets of output multiplexers to output all the sets of output clock signals to the groups of memory chips, according to a detection result indicating that all the plurality pairs of input clock signals are toggling.

7. The clock driver of claim 1, wherein the clock driver is integrated in a memory device.

8. A memory device, comprising:
a plurality groups of memory chips; and
a clock driver, comprising:
an input multiplexer for receiving a plurality pairs of input clock signals and an input selection signal, and for selectively outputting one pair of the plurality pairs of input clock signals according to the input selection signal;
a phase locking loop (PLL) coupled to the input multiplexer to receive one pair of the plurality pairs of input clock signals, and for generating a PLL clock signal according to the received pair of input clock signals;
at least two sets of output multiplexers coupled to the PLL to receive the PLL clock signal and an output selection signal, wherein each set of output multiplexers are configured to selectively output the PLL clock signal as a set of output clock signals according to the output selection signal to drive at least one group of memory chips; and a control module configured to detect toggling of the plurality pairs of input clock signals and generate the input selection signal and the output selection signal based on a detection result of the toggling of the plurality pairs of input clock signals.

9. The memory device of claim 8, wherein the clock driver further comprises:
at least two sets of clock trees, each clock tree being coupled between an output multiplexer of the at least two sets of output multiplexers and a group of memory chips and configured for introducing an offset into the set of output clock signals for the group of memory chips.

10. The memory device of claim 9, wherein the clock driver further comprises:
at least two sets of output buffers, each output buffer being coupled between a clock tree and a group of memory chips.

11. The memory device of claim 8, wherein each set of the at least two sets of output multiplexers are further coupled to receive a pair of input clock signals as a pair of bypass clock signals, and the output multiplexers are further configured to selectively output the pair of bypass clock signals and the pair of PLL output signals according to the output selection signal.

12. The memory device of claim 8, wherein the control module is configured to disable the outputting of a set of output clock signals which are associated with a pair of input clock signals according to a detection result indicating that the pair of input clock signals are not toggling.

13. The memory device of claim 8, wherein the control module is configured to control the input multiplexer to send either of the plurality pairs of input clock signals to the PLL, and enable the at least two sets of output multiplexers to output all the sets of output clock signals to the groups of memory chips, according to a detection result indicating that all the plurality pairs of input clock signals are toggling.

14. A method for clocking a memory device, wherein the method comprises:
detecting, via a control module, toggling of a plurality pairs of input clock signals and generating an input selection signal and an output selection signal based on a detection result of the toggling of the plurality pairs of input clock signals;
selectively outputting, via an input multiplexer, one pair of the plurality pairs of input clock signals according to the input selection signal;
generating, via a phase locking loop (PLL), a PLL clock signal based on the pair of input clock signals received from the input multiplexer; and
outputting, via at least two sets of output multiplexers, the PLL clock signal as a set of output clock signals to at least one group of memory chips to drive the at least one group of memory chips.

* * * * *